United States Patent
Lee et al.

(10) Patent No.: US 8,542,033 B2
(45) Date of Patent: Sep. 24, 2013

(54) DOMINO LOGIC CIRCUITS AND PIPELINED DOMINO LOGIC CIRCUITS

(75) Inventors: Hyoung-Wook Lee, Seoul (KR); Gun-Ok Jung, Yongin-si (KR); Suhwan Kim, Seoul (KR); Ah-Reum Kim, Daegu (KR); Rahul Singh, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/234,811

(22) Filed: Sep. 16, 2011

(65) Prior Publication Data

US 2012/0139584 A1 Jun. 7, 2012

(30) Foreign Application Priority Data

Dec. 6, 2010 (KR) ................. 10-2010-0123239

(51) Int. Cl.
*H03K 19/00* (2006.01)
(52) U.S. Cl.
USPC .................. 326/98; 326/93; 326/95
(58) Field of Classification Search
USPC .............. 326/98, 93, 95, 104, 112, 119, 129
See application file for complete search history.

(56) References Cited

U.S. PATENT DOCUMENTS

| | | | | |
|---|---|---|---|---|
| 5,258,666 A * | 11/1993 | Furuki | ............................ | 326/106 |
| 6,600,340 B2 * | 7/2003 | Krishnamurthy et al. | ...... | 326/98 |
| 6,876,232 B2 * | 4/2005 | Yoo | .................................. | 326/98 |
| 7,830,178 B2 * | 11/2010 | Sasagawa | ........................ | 326/97 |
| 7,852,121 B2 * | 12/2010 | Rhee et al. | ........................ | 326/98 |
| 2002/0070758 A1 | 6/2002 | Krishnamurthy et al. | | |
| 2004/0056687 A1 * | 3/2004 | Azam | ............................. | 326/95 |
| 2004/0257115 A1 * | 12/2004 | Bertram et al. | .................. | 326/98 |
| 2005/0127950 A1 * | 6/2005 | Ngo | ................................. | 326/95 |
| 2008/0036502 A1 * | 2/2008 | Lundberg et al. | ............... | 326/98 |
| 2008/0100344 A1 * | 5/2008 | Ngo et al. | ........................ | 326/98 |

FOREIGN PATENT DOCUMENTS

| | | |
|---|---|---|
| JP | 64-024624 A | 1/1989 |
| KR | 2001-0060578 A | 7/2001 |

OTHER PUBLICATIONS

Rahul Singh, et al., "Footer Voltage Feedforward Domino Technique for Wide Fan-In Dynamic Logic", Department of Electrical Engineering, Seoul National University, pp. 224-229, 2010.

* cited by examiner

*Primary Examiner* — Shawki Ismail
*Assistant Examiner* — Christopher Lo
(74) *Attorney, Agent, or Firm* — Harness, Dickey & Pierce, P.L.C.

(57) ABSTRACT

A domino logic circuit includes a first evaluation unit, a second evaluation unit and an output unit. The first evaluation unit precharges a first dynamic node, discharges a footer node in a first phase of a clock signal, and evaluates a plurality of input signals to determine a logic level of the first dynamic node in a second phase of the clock signal. The second evaluation unit precharges a second dynamic node in the first phase of the clock signal, and determines a logic level of the second dynamic node in response to a logic level of the footer node in the second phase of the clock signal. The output unit provides an output signal having a logic level according to levels of a first voltage of the first dynamic node and a second voltage of the second dynamic node.

12 Claims, 8 Drawing Sheets

130

140

DOMINO LOGIC CIRCUITS AND PIPELINED DOMINO LOGIC CIRCUITS

CROSS-REFERENCE TO RELATED APPLICATIONS

This application claims priority under 35 U.S.C. §119 to Korean Patent Application No. 2010-0123239, filed on Dec. 6, 2010 in the Korean Intellectual Property Office (KIPO), the entire contents of which are herein incorporated by reference.

BACKGROUND

1. Technical Field

Example embodiments relate to semiconductor devices, and more particularly to a domino logic circuit and pipelined domino logic circuit.

2. Description of the Related Art

In general, it is well known that domino circuits occupy a small circuit area, provide fast switching speed, and are widely employed in high-performance microprocessors. When very deep submicron (VDSM) technologies are applied to the domino circuits, the domino circuits are sensitive to noises.

In addition, as level of a power supply voltage is lowered, ratio of noises to power supply voltages increases. The VDSM technologies and the low power supply voltage may affect the domino circuits.

SUMMARY

At least some example embodiments provide a domino logic circuit capable of operating fast with robustness to noises.

At least some example embodiments provide a pipelined domino logic circuit capable of operating fast with robustness to noises.

According to at least some example embodiments, a domino logic circuit includes a first evaluation unit, a second evaluation unit and an output unit. The first evaluation unit precharges a first dynamic node, discharges a footer node in a first phase of a clock signal, and evaluates a plurality of input signals to determine a logic level of the first dynamic node in a second phase of the clock signal. The second evaluation unit, connected to the first dynamic node and the footer node, precharges a second dynamic node in the first phase of the clock signal, and determines a logic level of the second dynamic node in response to a logic level of the footer node in the second phase of the clock signal. The output unit, connected to the first and second dynamic nodes, provides an output signal having a logic level according to levels of a first voltage of the first dynamic node and a second voltage of the second dynamic node.

The first dynamic node and the footer node may share electrical charges in the second phase of the clock signal.

The second evaluation unit is configured to provide the second voltage between a first level and a second level, the first evaluation unit is configured to provide the first voltage between the first level and a third level, and the first evaluation unit is configured to provide a voltage between the third level and the second level at the footer node. The second level may be lower than the first level, and the third level may be lower than the first level and higher than the second level.

The first level may correspond to a level of a power supply voltage, and the second level may correspond to a level of a ground voltage.

The first evaluation unit may include a precharge transistor configured to precharge the first dynamic node based on the clock signal, a logic network, connected between the first dynamic node and the footer node, configured to determine the logic level of the first dynamic node in response to the input signals and a pull-down transistor configured to determine a voltage level of the footer node in response to the clock signal.

The precharge transistor may be a p-type metal-oxide semiconductor (PMOS) transistor, the PMOS transistor having a source connected to a power supply voltage, a drain connected to the first dynamic node and a gate configured to receive the clock signal. The pull-down transistor may be an n-type metal-oxide semiconductor (NMOS) transistor, the NMOS transistor having a source connected to a ground voltage, a drain connected to the footer node and a gate configured to receive an inverted clock signal.

The second evaluation unit may include a first PMOS transistor, connected to a power supply voltage and the second dynamic node, configured to precharge the second dynamic node in response to the clock signal, a first NMOS transistor having a drain connected to the second dynamic node, a gate connected to the footer node, a second NMOS transistor having a drain connected to a source of the first NMOS transistor, a source connected to a ground voltage and a gate configured to receive the clock signal, a third NMOS transistor having a drain connected to the footer node, a source connected to the ground voltage and a gate connected to the second dynamic node and a second PMOS transistor having a source connected to the first dynamic node, a gate connected to the footer node and a drain connected to the second dynamic node.

The second NMOS transistor may selectively connect the second dynamic node and the ground voltage based on the clock signal, the second PMOS transistor may operate as a first keeper transistor configured to maintain a voltage level of the footer node in response to a voltage level of the second dynamic node and the third NMOS transistor may operate as a second keeper transistor configured to maintain the voltage level of the second dynamic node in response to the voltage level of the footer node.

A size of the second PMOS transistor may be smaller than a size of the first PMOS transistor, and a size of the third NMOS transistor may be smaller than sizes of the first and second NMOS transistors.

The second evaluation unit may provide the second voltage transitioning from the power supply voltage to the ground voltage in response to a voltage of the footer node transitioning from an intermediate level to the ground voltage, the intermediate level may be between the power supply voltage and the ground voltage.

The output unit may include a NAND gate configured to perform a logical NAND operation on the first and second voltages to provide the output signal.

The NAND gate may include a first PMOS transistor, connected between a power supply voltage and an output node, which has a gate configured to receive the first voltage, the output signal being provided at the output node, a second PMOS transistor, connected between the power supply voltage and the output node in parallel with the first PMOS transistor, which has a gate configured to receive the second voltage, first and second NMOS transistors, connected in series between the output node and a ground voltage. The first NMOS transistor may have a gate configured to receive the first voltage, and the second NMOS transistor may have a gate configured to receive the second voltage.

The output unit may further include a keeper transistor connected between the power supply voltage and the first dynamic node. The keeper transistor configured to maintain a voltage level of the first dynamic node in response to a voltage level of the output node may be a third PMOS transistor having a gate configured to receive the output signal, and a size of the third PMOS transistor may be smaller than sizes of the first and second PMOS transistors.

The first evaluation unit is configured to connect the first dynamic node and the footer node in response to the input signals, the first evaluation unit and the second evaluation unit are cooperatively configured to provide a ground voltage at the second dynamic node faster than at the first dynamic node if the first dynamic node and the footer node are connected.

According to at least some example embodiments, a pipelined domino logic circuit includes a plurality of logic blocks sequentially connected. Each logic block includes a first evaluation unit, a second evaluation unit and an output unit. The first evaluation unit precharges a first dynamic node, discharges a footer node in a first phase of a clock signal, and evaluates a plurality of input signals to determine a logic level of the first dynamic node in a second phase of the clock signal. The second evaluation unit, connected to the first dynamic node and the footer node, precharges a second dynamic node in the first phase of the clock signal, and determines a logic level of the second dynamic node in response to a logic level of the footer node in the second phase of the clock signal. The output unit, connected to the first and second dynamic nodes, provides an output signal having a logic level according to levels of a first voltage of the first dynamic node and a second voltage of the second dynamic node.

At least another example embodiment discloses a domino logic circuit including a first evaluation unit configured to receive at least one input signal, a power supply voltage and a clock signal, the first evaluation unit including a first dynamic node and a footer node, the dynamic node having a first voltage, a second evaluation unit connected to the dynamic node by a first path and connected to the footer node by a second path, a second dynamic node connected to the second evaluation unit, the second dynamic node configured to have a second voltage, and an output unit configured to receive the first voltage over the first path and receive the second voltage over the second path, the first and second paths having different transferring speeds to the output unit.

Accordingly, the noise immunity of the domino logic circuit may be enhanced by limiting the voltage swing of the first dynamic node and pulling down the second dynamic node fast, and power consumption may be reduced by decreasing sizes of the keeper transistors.

BRIEF DESCRIPTION OF THE DRAWINGS

Illustrative, non-limiting example embodiments will be more clearly understood from the following detailed description taken in conjunction with the accompanying drawings.

DETAILED DESCRIPTION OF EXAMPLE EMBODIMENTS

Figure 1:
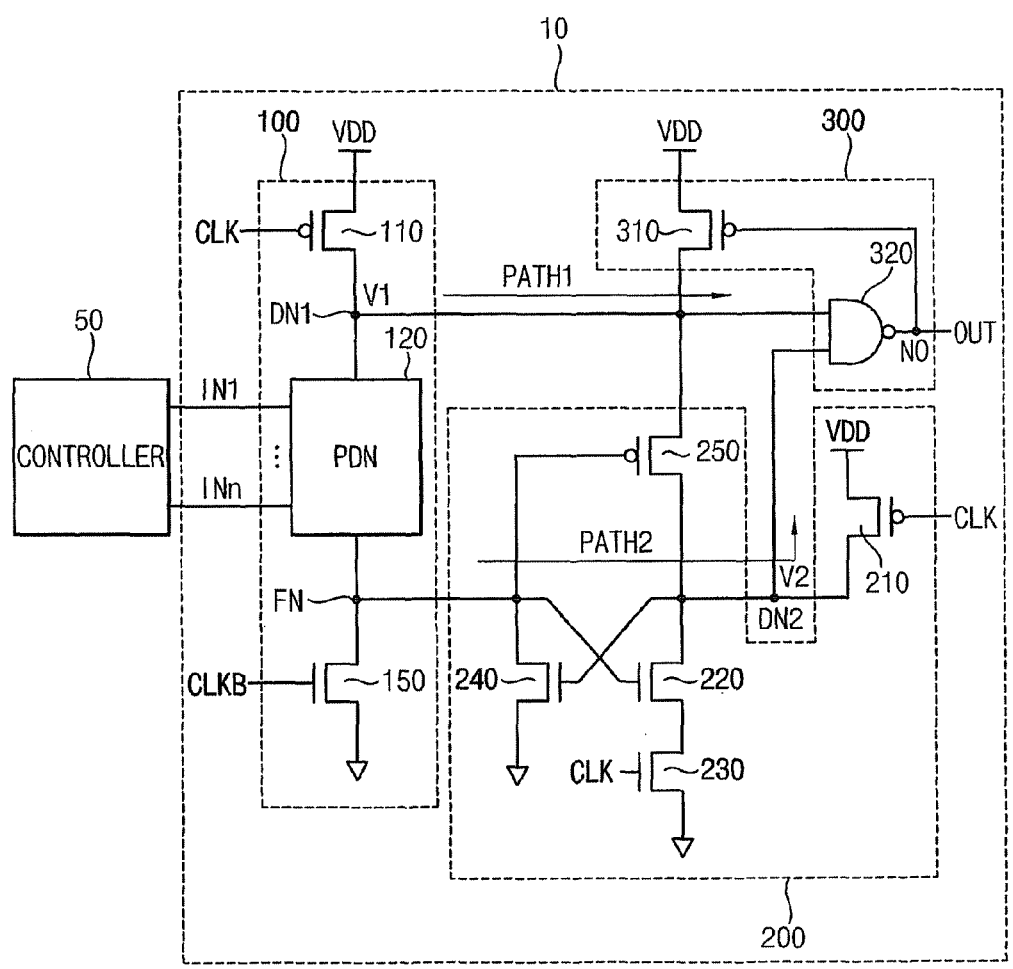
FIG. 1 is a circuit diagram illustrating a domino logic circuit according to at least some example embodiments.

Various example embodiments will be described more fully hereinafter with reference to the accompanying drawings, in which some example embodiments are shown. Inventive concepts may, however, be embodied in many different forms and should not be construed as limited to the example embodiments set forth herein. Rather, these example embodiments are provided so that this disclosure will be thorough and complete, and will fully convey the scope of inventive concepts to those skilled in the art. In the drawings, the sizes and relative sizes of layers and regions may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of inventive concepts. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which inventive concepts belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a circuit diagram illustrating a domino logic circuit according to at least some example embodiments.

Referring to FIG. 1, a domino logic circuit 10 includes a first evaluation unit 100, a second evaluation unit 200 and an output unit 300.

The first evaluation unit 100 includes a precharge transistor 110, a logic network 120 and a pull-down transistor 150. The precharge transistor 110 is connected between a power supply voltage VDD and a first dynamic node DN1. The logic network 120 is connected between the first dynamic node DN1 and a footer node FN. The pull-down transistor 150 is connected between the footer node FN and a ground voltage. The precharge transistor 110 may be a p-type metal-oxide semiconductor (PMOS) transistor which has a source connected to the power supply voltage VDD, a gate receiving a clock signal CLK, and a drain connected to the first dynamic node DN1. The pull-down transistor 150 may be n-type metal-oxide semiconductor (NMOS) transistor which has a drain connected to the footer node FN, a gate receiving an inverted clock signal CLKB that the clock signal CLK is inverted and a source connected to the ground voltage. The logic network 120 forms or cuts-off a current path between the first dynamic node DN1 and the footer node FN in response to a plurality of input signals IN1~INn.

Figure 2:
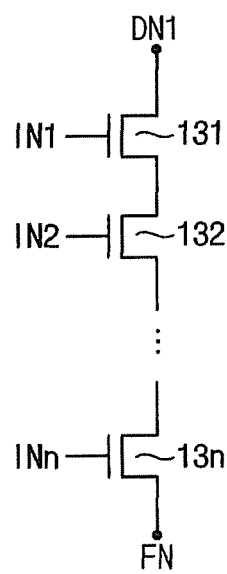
FIG. 2 illustrates an example of a logic network in FIG. 1 according to at least some example embodiments.

FIG. 2 illustrates an example of the logic network in FIG. 1 according to at least some example embodiments.

Referring to FIG. 2, a logic network 130 may include a plurality of NMOS transistors 131~13n which are connected in series between the first dynamic node DN1 and the footer node FN. Each of the NMOS transistors 131~13n has a gate receiving each of the input signals IN1~INn. The input signals IN1~INn may include control signals or selection signals. The logic network 130 of FIG. 3 may implement an AND logic. A controller 50 generates the input signals IN1~INn.

Figure 3:
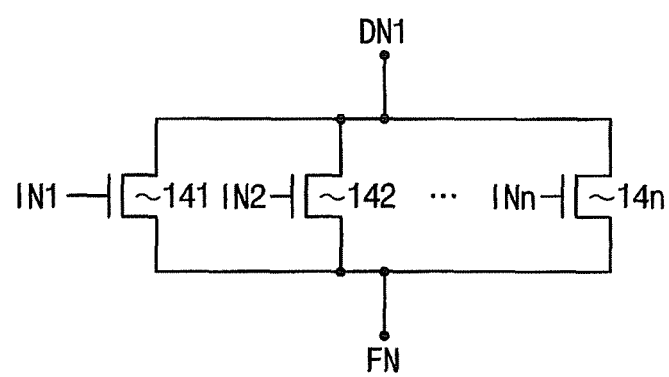
FIG. 3 illustrates another example of the logic network in FIG. 1 according to at least some example embodiments.

FIG. 3 illustrates another example of the logic network in FIG. 1 according to at least some example embodiments.

Referring to FIG. 3, a logic network 140 may include a plurality of NMOS transistors 141~14n which are connected in parallel between the first dynamic node DN1 and the footer node FN. Each of the NMOS transistors 141~14n has a gate receiving each of the input signals IN1~INn. The input signals IN1~INn may include control signals or selection signals. The logic network 140 of FIG. 4 may implement an OR logic.

Therefore, the first evaluation unit 100 precharges the first dynamic node DN1 to a level of the power supply voltage VDD and discharges the footer node FN to a level of the ground voltage in a first phase (i.e., logic low level) of the clock signal CLK. In addition, the first evaluation unit 100 evaluates the input signals IN1~INn to determine a logic level of the first dynamic node DN1 in a second phase (i.e., logic high level) of the clock signal CLK. When the logic network 120 is turned on in the second phase of the clock signal CLK, the precharge transistor 110 and the pull-down transistor 150 are turned off, and thus, electrical charges are shared between the first dynamic node DN1 and the footer node FN. That is, when the logic network 120 is turned on in the second phase of the clock signal CLK, a current path is formed between the first dynamic node DN1 and the footer node FN, and thus, a voltage level of the first dynamic node DN1 is substantially the same as a voltage level of the footer node FN.

Referring again to FIG. 1, the second evaluation unit 200 is connected to the first dynamic node DN1, the footer node FN and a second dynamic node DN2. The second evaluation unit 200 may include PMOS transistors 210 and 250 and NMOS transistors 220, 230 and 240.

The PMOS transistor 210 is connected to the power supply voltage VDD and the second dynamic node DN2, and the PMOS transistor 210 has a gate receiving the clock signal CLK. Therefore, the PMOS transistor 210 precharges the second dynamic node DN2 to a level of the power supply voltage VDD in the first phase of the clock signal CLK. The NMOS transistors 220 and 230 are connected in series between the second dynamic node DN2 and the ground voltage. The NMOS transistor 220 has drain connected to the second dynamic node DN2 and a gate connected to the footer node FN. The NMOS transistor 230 has a drain connected to a source of the NMOS transistor 220, a gate receiving the clock signal CLK and a source connected to the ground voltage. The NMOS transistor 240 has a drain connected to the footer node FN, a gate connected to the second dynamic node DN2 and a source connected to the ground voltage.

When the PMOS transistor 210 is turned on in the second phase of the clock signal CLK, the second dynamic node DN2 is precharged to the power supply voltage VDD level. When second dynamic node DN2 is precharged to the power supply voltage VDD level, the NMOS transistor 240 is turned on while the NMOS transistor 150 is also turned on in response to the inverted clock signal CLKB, and thus the footer node FN is discharged to the ground voltage level. Therefore, the NMOS transistor 220 is turned off in response to the voltage level of the footer node FN and the NMOS transistor 230 is turned off in response to the clock signal CLK. As a result, the second dynamic node DN2 has the power supply voltage VDD level and the footer node FN has the ground voltage level in the first phase of the clock signal CLK.

When the clock signal CLK transitions from the first phase to the second phase, the PMOS transistor 210 is turned off, the NMOS transistor 150 is turned off, and the logic network 120 is turned on. When the logic network 120 is turned on, a current path is formed between the first dynamic node DN1 and the footer node FN, electrical charges are shared between the first dynamic node DN1 and the footer node FN. Therefore, the first dynamic node DN1 transitions from the power supply voltage VDD level to an intermediate voltage level, and the footer node FN transitions from the ground voltage level to the intermediate voltage level. The intermediate voltage level is a level between the power supply voltage VDD level and the ground voltage level. When the footer node FN transitions from the ground voltage level to the intermediate voltage level, the NMOS transistor 220 is turned on the intermediate voltage level of the footer node FN. The NMOS transistor 230 is already turned on in response to the clock signal CLK, and the second dynamic node DN2 is discharged to the ground voltage level. When the second dynamic node DN2 is discharged to the ground voltage level, the NMOS transistor 240 is turned off in response to the voltage level of the second dynamic node DN2, the voltage level of the footer node FN may be maintained at the intermediate voltage level.

The NMOS transistor 230 is connected between the NMOS transistor 220 and the ground voltage, and the NMOS transistor 230 may prevent a DC path from being formed between the second dynamic node DN2 and the ground voltage. The DC path may be formed between the second dynamic node DN2 and the ground voltage because the NMOS transistor 220 may be turned on in response to rising of the voltage level of the footer node FN in the first phase of the clock signal CLK. In addition, the NMOS 230 transistor may prevent the second dynamic node DN2 from being influenced by noises from the ground voltage. In addition, the PMOS transistor 250 may maintain the voltage level of the second dynamic node DN2 in response to the voltage level of the footer node FN, and the NMOS transistor 240 may maintain the voltage level of the footer node FN in response to the voltage level of the second dynamic node DN2. That is, the PMOS transistor 250 and the NMOS transistor 240 may operate as keeper transistors. Because the PMOS transistor 250 and the NMOS transistor 240 operate as keeper transistors, the PMOS transistor 250 and the NMOS transistor 240 may be manufactured such that the PMOS transistor 250 and the NMOS transistor 240 have robustness to noises, and the PMOS transistor 250 and the NMOS transistor 240 have minimum sizes for having self-reverse bias effect. That is, a size of the NMOS transistor 240 may be smaller than sizes of the NMOS transistors 220 and 230, and a size of the PMOS transistor 250 may be smaller than a size of the PMOS transistor 210.

The output unit 300 is connected to the first dynamic node DN1 and the second dynamic node DN2. The output unit 300 may include a PMOS transistor 310 and a NAND gate 320. The PMOS transistor 310 has a source connected to the power supply voltage VDD, a gate connected to an output node NO where the output signal OUT is provided, and a drain connected to the first dynamic node DN1. The PMOS transistor 310 may operate as a keeper transistor for maintaining the voltage level of the first dynamic node in response to the output signal OUT. The NAND gate 320 performs a NAND operation on a first voltage V1 at the first dynamic node DN1 and a second voltage V2 at the second dynamic node DN2 to provide the output signal OUT.

Figure 4:
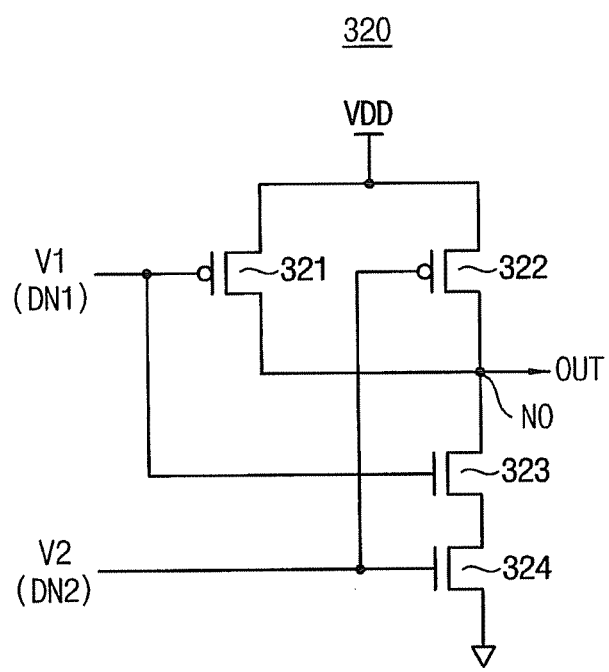
FIG. 4 is a circuit diagram illustrating an example of a NAND gate in FIG. 1 according to at least some example embodiments.

FIG. 4 is a circuit diagram illustrating an example of the NAND gate in FIG. 1 according to at least some example embodiments.

Referring to FIG. 4, the NAND gate 320 may include PMOS transistors 321 and 322, and NMOS transistors 323 and 324. The PMOS transistor 321 has a source connected to the power supply voltage VDD, a gate receiving the first voltage V1 and a drain connected to the output node NO. The PMOS transistor 322 has a source connected to the power supply voltage VDD, a gate receiving the second voltage V2 and a drain connected to the output node NO. The PMOS transistors 321 and 322 are connected in parallel between the power supply voltage VDD and the output node NO. The NMOS transistors 323 and 324 are connected in series between the output node NO and the ground voltage. The NMOS transistor 323 has a gate receiving the first voltage V1, and the NMOS transistor 324 has a gate receiving the second voltage V2.

As will be described with reference to FIG. 5, the PMOS transistor 321 transfers a change of the voltage level of the first dynamic node DN1 to the output node NO, and the PMOS transistor 322 transfer a change of the voltage level of the second dynamic node DN2 to the output node NO. The first voltage V1 at the first dynamic node DN1 swings between the power supply voltage VDD level and the intermediate voltage level, and the second voltage V2 at the second dynamic node DN2 swings between the power supply voltage VDD level and the ground voltage level, and thus, the NAND gate 320 may be highly skewed. In addition, a size of the PMOS transistor 310 operating as a keeper transistor may be smaller than sizes of the PMOS transistors 321 and 322. According to some example embodiments, sizes of the keeper transistors 240, 250 and 310 may be smaller than sizes of other transistors such that self-reverse bias effect may be obtained and current consumption may be reduced.

Figure 5:
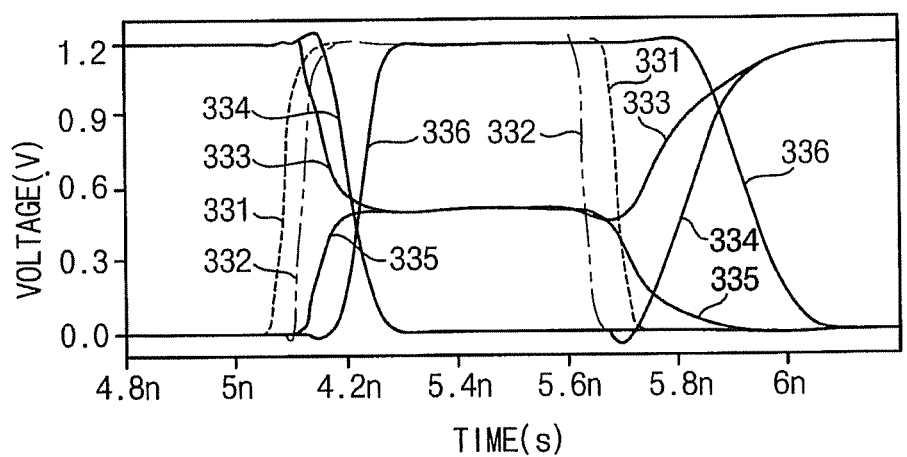
FIG. 5 is a timing diagram illustrating operation of a domino logic circuit of FIG. 1 according to at least some example embodiments.

FIG. 5 is a timing diagram illustrating operation of the domino logic circuit of FIG. 1 according to at least some example embodiments.

In FIG. 5, a reference numeral 331 denotes the clock signal CLK, a reference numeral 332 denotes the input signal IN, a reference numeral 333 denotes the first voltage V1 at the first dynamic node DN1, a reference numeral 334 denotes the second voltage V2 at the second dynamic node DN2, a reference numeral 335 denotes the voltage level of the footer node FN, and a reference numeral 336 denotes the output signal OUT.

Hereinafter, there will be detailed description on the operation of the domino logic circuit 10 of FIG. 1 with reference to FIGS. 1, 4 and 5.

The input signal IN has a logic low level in the first phase (i.e., logic low level) of the clock signal CLK. Therefore, the precharge transistor 110 is turned on, the pull down transistor 150 is turned on, and the PMOS transistor 210 is turned on. Accordingly, the first and second dynamic nodes DN1 and DN2 are precharged to the power supply voltage VDD level and the footer node FN is discharged to the ground voltage level in the first phase of the clock signal CLK. At this time, the PMOS transistors 321 and 322 in the NAND gate 320 are turned off, and the NMOS transistors 323 and 324 in the NAND gate 320 are also turned on. Therefore, the output node NO is pulled down to the ground voltage level, and thus, the output signal OUT has logic low level.

The clock signal CLK transitions from the first phase to the second phase (i.e., logic high level), and the input signal IN transitions from logic low level to logic high level. Therefore, the precharge transistor 110 is turned off, the pull down transistor 150 is turned off, the PMOS transistor 210 is turned off and the NMOS transistor 230 is turned on. Accordingly, a current path is formed between the first dynamic node DN1 and the footer node FN, and thus electrical charges are shared by the first dynamic node DN1 and the footer node FN. Therefore, the first dynamic node DN1 transitions from the power supply voltage VDD level to the intermediate voltage level, the footer node FN transitions from the ground voltage level to the intermediate voltage level. At this time, the NMOS transistor 220 is turned on in response to the footer node FN transitioning from the ground voltage level to the intermediate voltage level, and thus, the second dynamic node DN2 is discharged to the ground voltage level. A first parasitic capacitance of the first dynamic node DN1 with regard to the ground voltage is due to the logic network 120 and the pull-down transistor 150, and a second parasitic capacitance of the second dynamic node DN2 with regard to the ground voltage is due to the NMOS transistors 220 and 230. Therefore, the second parasitic capacitance is smaller than the first parasitic capacitance. Accordingly, the second dynamic node DN2 is pulled down to the ground voltage faster, in response to FN transitioning from the ground voltage level to the intermediate voltage level than the first dynamic node DN1 transitions from the power supply voltage VDD level to the intermediate voltage level. At this time, the PMOS transistor 322 in the NAND gate 320 are turned on in response to the second voltage V2 of the second dynamic node DN2, and the NMOS transistor 324 in the NAND gate 320 is turned off in response to the second voltage V2 of the second dynamic node DN2. Therefore, the output node NO is pulled up to the power supply voltage VDD level, and thus, the output signal OUT has logic high level.

The clock signal CLK transitions from the second phase to the first phase and the input signal IN transitions from high level to logic low level. Therefore, the first dynamic node DN1 transitions from the intermediate voltage level to the power supply voltage VDD level, the footer node FN transitions from the intermediate voltage level to the ground voltage level, and the second dynamic node DN2 transitions from the ground voltage level to the power supply voltage VDD level.

In the domino logic circuit 10 according to some example embodiments, the voltage level of the first dynamic node DN1 swings between the power supply voltage VDD level (a first level) and the intermediate voltage level (a third level), the voltage level of the footer node FN swings between the ground voltage level (a second level) and the intermediate voltage level, and the voltage level of the second dynamic node DN2 fully swings between the power supply voltage VDD level and the ground voltage level fast, in response to the input signal IN. Therefore, the domino logic circuit 10 may enhance immunity to noise and the operating speed by adopting two parallel paths PATH1 and PATH2 which have different transferring speeds to the NAND gate 320. The path PATH1 has a greater transfer speed than the path PATH2. In addition, the domino logic circuit 10 may compensate for power overhead and reduce power consumption by limiting swinging range of the first dynamic node DN1 to a range between the power supply voltage VDD level and the intermediate voltage level. The first dynamic node DN1 has a greater parasitic capacitance than the second dynamic node DN2.

Figure 6:
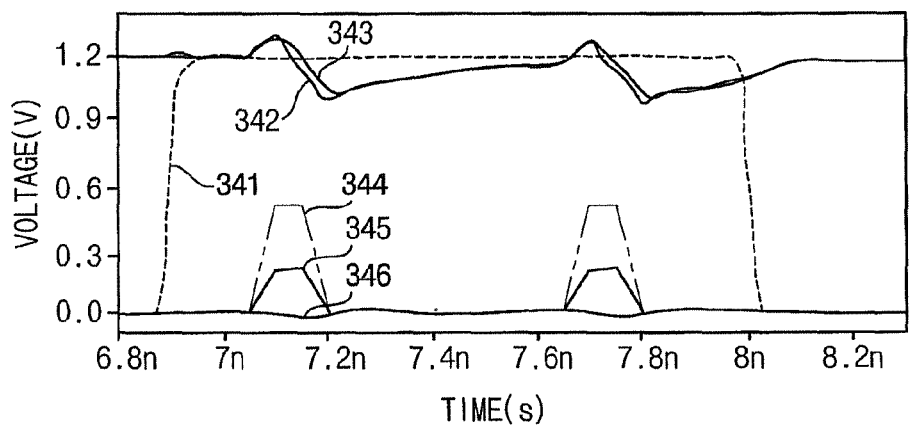
FIG. 6 illustrates a noise response of the domino logic circuit of FIG. 1 according to at least some example embodiments.

FIG. 6 illustrates a noise response of the domino logic circuit of FIG. 1 according to at least some example embodiments.

In FIG. 6, a reference numeral 341 denotes the clock signal CLK, a reference numeral 342 denotes the first voltage V1 of the first dynamic node DN1, a reference numeral 343 denotes the second voltage V2 of the second dynamic node DN2, a reference numeral 344 denotes a noise, a reference numeral 345 denotes the voltage level of the footer node FN, and a reference numeral 346 denotes the output signal OUT.

Referring to FIG. 6, it is noted that the domino logic circuit 10 has robustness to noises because of the keeper transistors 240, 250, and 310.

FIGS. 7A to 7D are simulation diagrams illustrating performance of the domino logic circuit of FIG. 1 according to at least some example embodiments.

In FIGS. 7A to 7D, respective circuits are simulated based in 1.2V 90 nm complementary metal-oxide semiconductor (CMOS) processes, and each of the keeper transistors 240, 250, and 310 has a size smaller than a size of corresponding transistor about by 60%.

Figure 7A:
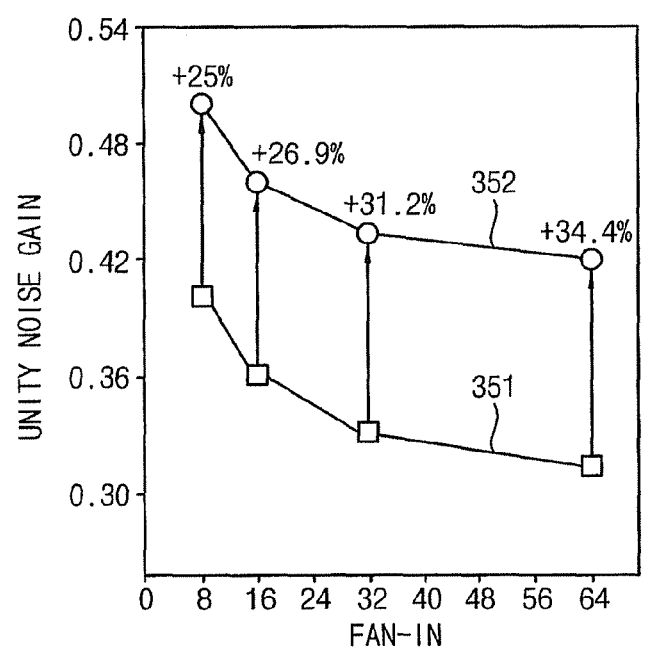
FIGS. 7A to 7D are simulation diagrams illustrating performance of the domino logic circuit of FIG. 1 according to at least some example embodiments.

FIG. 7A illustrates unity noise gain according to a number of the input signals when each of the domino logic circuit 10 and the conventional footless domino logic circuit is used as a multiplexer.

In FIG. 7A, a reference numeral 351 is related to the conventional footless domino logic circuit, and a reference numeral 352 is related to the domino logic circuit 10.

Figure 7B:
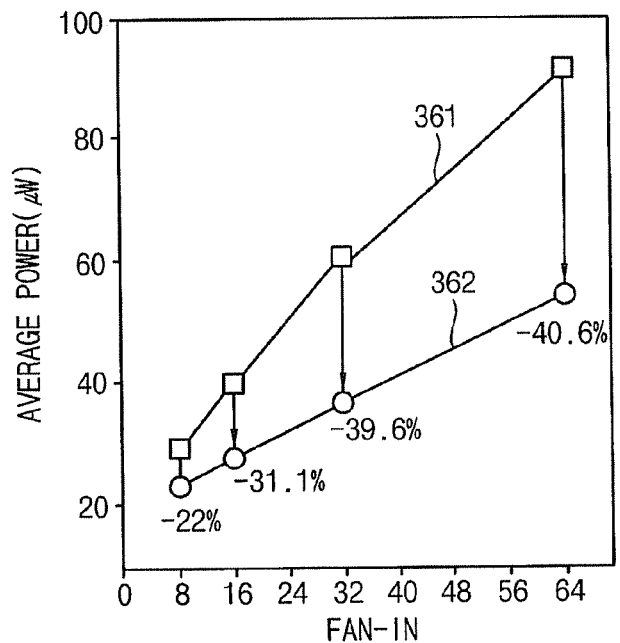

FIG. 7B illustrates average power consumption according to a number of the input signals when each of the domino logic circuit 10 and the conventional footless domino logic circuit is used as a multiplexer.

In FIG. 7B, a reference numeral 361 is related to the conventional footless domino logic circuit, and a reference numeral 362 is related to the domino logic circuit 10.

Referring to FIGS. 7A and 7B, it is noted that the domino logic circuit 10 illustrates 25~34% increased unity noise gain and 22~41% decreased average power consumption according to a number of the input signals with respect to the conventional footless domino logic circuit.

Figure 7C:
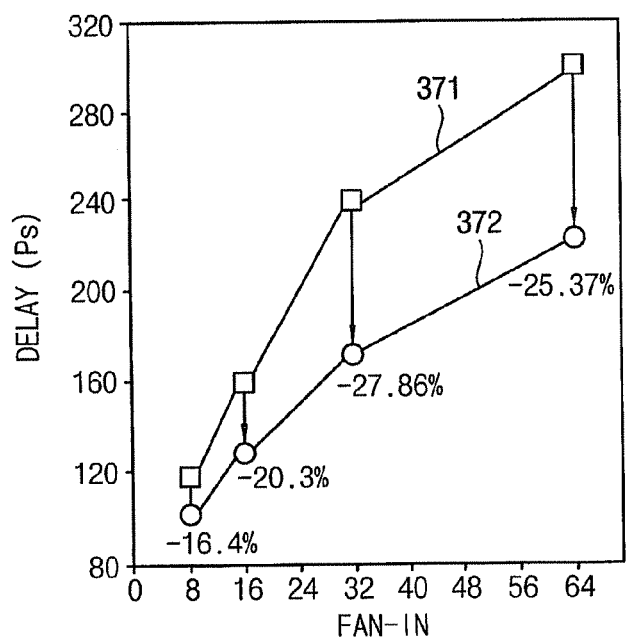

FIG. 7C illustrates delay according to a number of the input signals when each of the domino logic circuit 10 and the conventional diode-footed domino logic circuit is used as a multiplexer.

In FIG. 7C, a reference numeral 371 is related to the conventional diode-footed domino logic circuit, and a reference numeral 372 is related to the domino logic circuit 10.

Figure 7D:
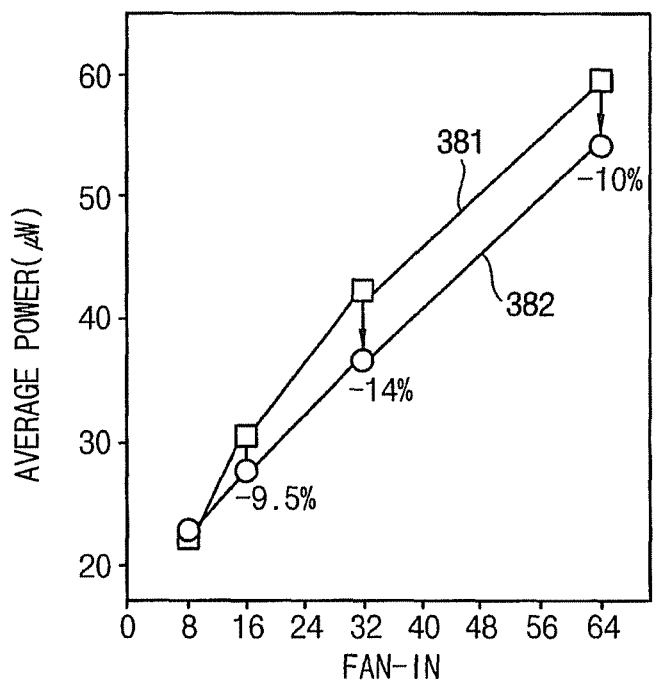

FIG. 7D illustrates average power consumption according to a number of the input signals when each of the domino logic circuit 10 and the conventional diode-footed domino logic circuit is used as a multiplexer.

In FIG. 7D, a reference numeral 381 is related to the conventional diode-footed domino logic circuit, and a reference numeral 382 is related to the domino logic circuit 10.

Referring to FIGS. 7C and 7D, it is noted that the domino logic circuit 10 illustrates 16~28% increased delay performance and 10~14% decreased average power consumption according to a number of the input signals with respect to the conventional diode-footed domino logic circuit.

[Table 1] below illustrates performance of the domino logic circuit 10 when the domino logic circuit 10 is implemented with a 16-bit multiplexer. In [Table 1], performance of the conventional footless domino logic circuit is altogether illustrated for the sake of comparison.

TABLE 1

|  | PDP | UNG | ANTE | EANTE |
|---|---|---|---|---|
| footless domino logic circuit | 3.98 | 0.36 | 32 | 0.8 |
| domino logic circuit 10 | 3.11 | 0.46 | 40 | 1.45 |
| Enhancement (%) |  | 28 | 25 | 81 |

In [Table 1], PDP denotes per delay product, UNG denotes unit noise gain, ANTE denotes average noise threshold, and EANTE denotes energy normalized average noise threshold.

Referring to [Table 1], it is noted that EANTE of the domino logic circuit 10 is enhanced about 81% with respect to the conventional footless domino logic circuit because the domino logic circuit 10 has a better noise immunity and a reduced power consumption with respect to the conventional footless domino logic circuit under the same noise circumstance.

Figure 8:
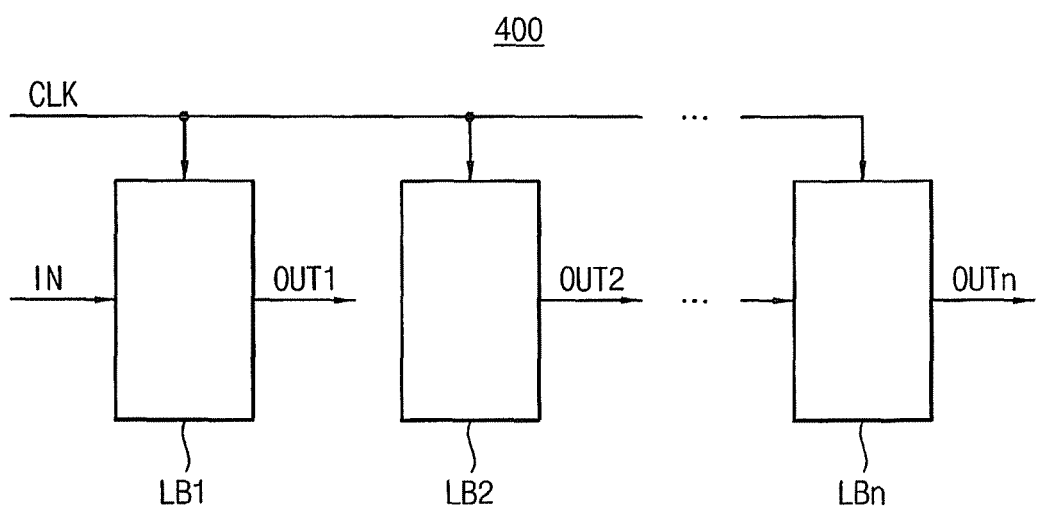
FIG. 8 is a block diagram illustrating a pipelined domino logic circuit according to at least some example embodiments.

FIG. 8 is a block diagram illustrating a pipelined domino logic circuit according to at least some example embodiments.

Referring to FIG. 8 a pipelined domino logic circuit 400 includes plurality of sequentially-connected logic blocks LB1, LB2, LBN.

Each of the logic blocks may include the domino logic circuit 10 of FIG. 1.

Hereinafter, the operation of the pipelined domino logic circuit 400 will be described with reference to FIG. 1 and FIG. 8. In the present example embodiment, it is assumed that the domino logic circuit 10 of FIG. 1 is included in a logic block LB2 of FIG. 8.

The logic block LB2 includes a first evaluation unit 100 that precharges a first dynamic node DN1, discharges a footer node FN in a first phase of a clock signal CLK, and evaluates a plurality of input signals IN1~INn to determine a logic level of the first dynamic node DN1 in a second phase of the clock signal CLK, a second evaluation unit 200, connected to the first dynamic node DN1 and the footer node FN, which precharges a second dynamic node DN2 in the first phase of the clock signal CLK and determines a logic level of the second dynamic node DN2 in response to a logic level of the footer node FN in the second phase of the clock signal CLK and an output unit 300, connected to the first and second dynamic nodes DN1 and DN2, which provides the logic block LB3 with an output signal OUT having a logic level according to levels of a first voltage V1 of the first dynamic node DN1 and a second voltage V2 of the second dynamic node DN2. Each of the logic blocks LB1, LB2, . . . , LBN provides each of output signals OUT1~OUTn. Each of the logic blocks LB1, LB2, . . . , LBN limits a voltage swing of the first dynamic node DN1, and pull-down speed of the second dynamic node DN2 is increased, and thus, the pipelined domino logic circuit 400 may reduce power consumption and increase operating speed.

Figure 9:
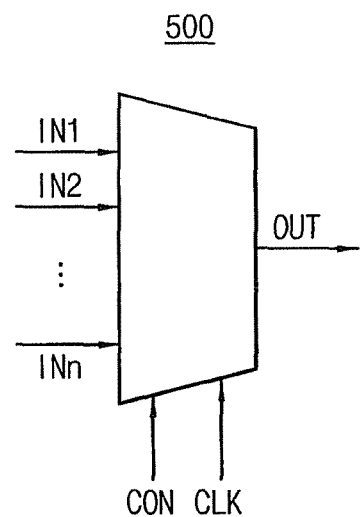
FIG. 9 illustrates a multiplexer according to at least some example embodiments.

FIG. 9 illustrates a multiplexer according to at least some example embodiments.

A multiplexer 500 of FIG. 9 may be implemented with the domino logic circuit 10 of FIG. 1.

Referring to FIG. 9, the multiplexer 500 receives a plurality of input signals IN1~INn, and selects at least one of the input signals IN1~INn to provide the selected one as an output signal OUT, in response to a control signal CON and a clock signal CLK. A number of the input signals IN1~INn may vary. In addition, when at least one of the input signals IN1~INn is selected in response to the control signal CON and the clock signal CLK, the output signal OUT is provided according to logical combination of the input signals IN1~INn. In addition, some of the input signals IN1~INn may be used as the control signal CON, and the control signal CON may be provided externally.

Figure 10:
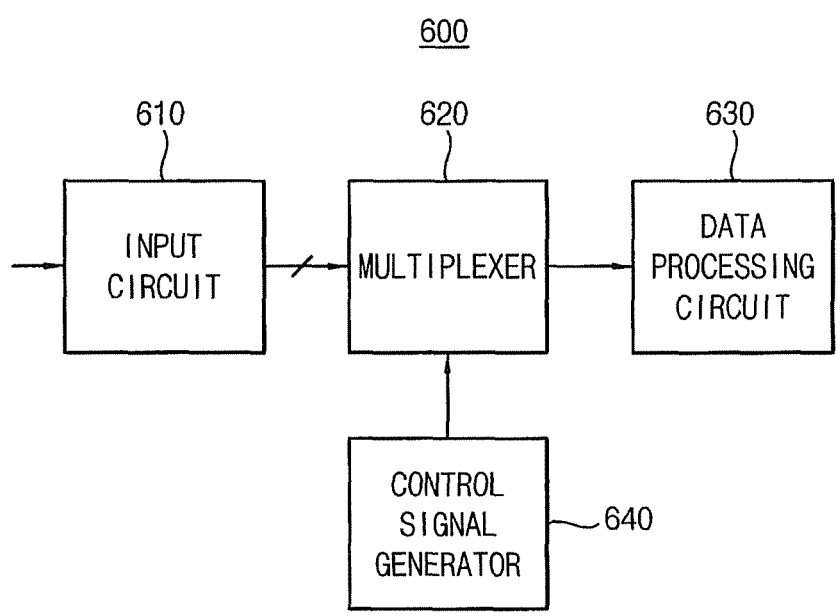
FIG. 10 is a block diagram illustrating a semiconductor device according to at least some example embodiments.

FIG. 10 is a block diagram illustrating a semiconductor device according to at least some example embodiments.

Referring to FIG. 10, a semiconductor device 600 may be any data processing device that can process data signals, for example, a CPU, a DSP, a video/audio chip, an ASIC, a SOC, an MP3 audio chip, a wireless audio chip, an audio codec chip, an MPEG4 codec chip, an h264 codec chip, a video codec chip, a codec chip, or a voice codec chip. In addition, the semiconductor device 600 may be any data processing device that operates at high speed with low power consumption. The semiconductor device 600 may be implemented by a semiconductor chip.

The semiconductor device 600 includes a data input circuit 610, a multiplexer 620, a data processing circuit 630, and a control signal generator 640. The data input circuit 610 transmits data signals, which are input from an outside of the semiconductor device 600 or generated within the semiconductor device 600, to the multiplexer 620. The multiplexer 620 multiplexes the data signals from the data input circuit 610 in response to at least one control signal output from the control signal generator 640 and transmits at least one multiplexed signal to the data processing circuit 630. The data processing circuit 630 performs various operations, e.g., buffering, writing, reading, encoding, decoding, image processing, level-up operation, level-down operation, and format conversion, on the signal output from the multiplexer 620. The multiplexer 620 may be implemented with the multiplexer 500 of FIG. 9.

Figure 11:
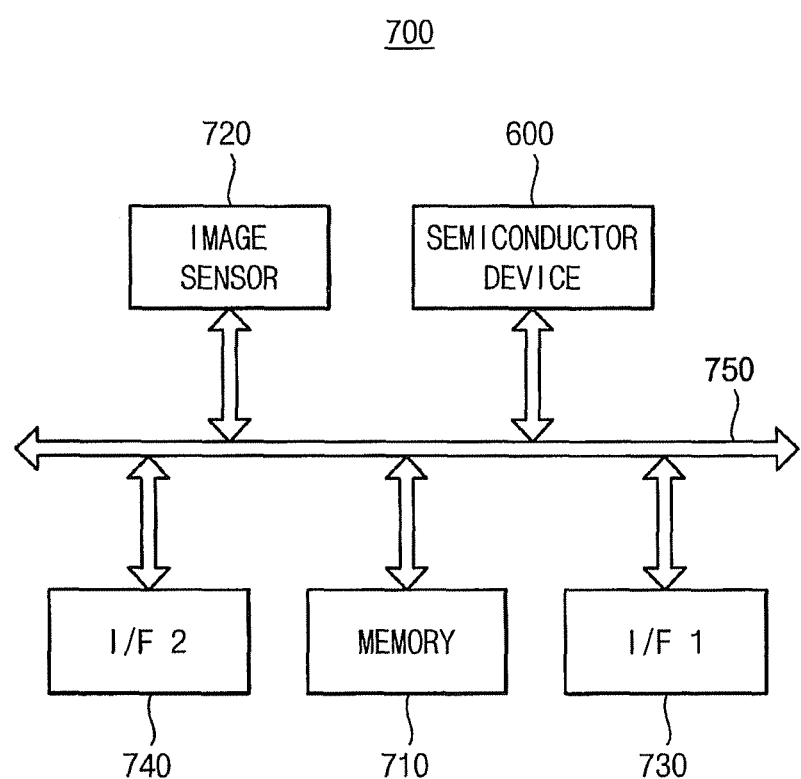
FIG. 11 is a block diagram illustrating an electronic device including the semiconductor device of FIG. 10 according to at least some example embodiments.

FIG. 11 is a block diagram illustrating an electronic device including the semiconductor device of FIG. 10 according to at least some example embodiments.

Referring to FIG. 11, an electronic device 700 includes a memory device 710 connected with a system bus 750 and the semiconductor device 600. The semiconductor device 600 may be implemented by a CPU, a DSP, a video/audio chip, an ASIC, a SOC, an MP3 audio chip, a wireless audio chip, an audio codec chip, an MPEG4 codec chip, an h264 codec chip, a video codec chip, a codec chip, or a voice codec chip. The semiconductor device 600 may control the writing, reading and verification reading operations of the memory device 710. For instance, the semiconductor device 600 may communicate data with an external device through an input/output interface (I/F), i.e., a first I/F 730. The semiconductor device 600 may communicate data with an image sensor 720 through the system bus 750. In addition, the semiconductor device 600 may communicate data with an external wireless device through a wireless I/F, i.e., a second I/F 740 via wireless connection.

When the electronic device 700 is implemented by a portable application, the electronic device 700 may additionally include a battery (not shown) which supply power to the memory device 710 and the semiconductor device 600. The portable application may be a portable computer, a digital camera, a personal digital assistant (PDA), a cellular phone, an MP3 player, a portable multimedia player (PMP), an automotive navigation system, a memory card, a smart card, a game machine, an electronic dictionary, an electronic instrument, a solid state disc, or a solid state drive.

The electronic device 700 may include the first I/F 730 to communicate data with an external data processing device. When the electronic device 700 is a wireless system, the electronic device 700 may include the semiconductor device 600, the memory device 710, and the wireless I/F 740. At this time, the wireless I/F 740 connected with the semiconductor device 600 through the system bus 750 may communicate data with an external wireless device (not shown) via wireless connection. For instance, the semiconductor device 600 may process data input through the wireless I/F 740 and store the processed data in the memory device 710. The semiconductor device 600 may also read data from the memory device 710 and transmit the data to the wireless I/F 740. The memory device 710 may include volatile memory, e.g., dynamic random access memory (DRAM) or static random access memory (SRAM), or non-volatile memory. In addition, the memory device 710 may be a hard disc drive that magnetically stores data. The memory device 710 may also be a hybrid hard disc drive. The wireless system may be a PDA, a portable computer, a wireless telephone, a pager, a radio frequency identification (RFID) reader, or an RFID system. The wireless system may also be a wireless local area network (WLAN) system or a wireless personal area network (WPAN) system. The wireless system may be a cellular network.

When the electronic device 700 is an image pickup device, the electronic device 700 may include the image sensor 720 which converts an optical signal into an electrical signal. The image sensor 720 may be an image sensor using a charge-coupled device (CCD) or an image sensor manufactured using a complementary metal-oxide semiconductor (CMOS) process. At this time, the electronic device 700 may be a digital camera, a mobile phone equipped with a digital camera, or a satellite equipped with a camera.

According to example embodiments, the noise immunity of the domino logic circuit may be enhanced by limiting the voltage swing of the first dynamic node and pulling down the second dynamic node fast, and power consumption may be reduced by decreasing sizes of the keeper transistors.

Example embodiments may be employed by various semiconductor devices and electronic devices.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of inventive concepts. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A domino logic circuit comprising:
   a first evaluation unit configured to precharge a first dynamic node and configured to discharge a footer node in a first phase of a clock signal, and configured to evaluate a plurality of input signals to determine a logic level of the first dynamic node in a second phase of the clock signal;
   a second evaluation unit connected to the first dynamic node and the footer node, the second evaluation unit configured to precharge a second dynamic node in the first phase of the clock signal, and configured to determine a logic level of the second dynamic node in response to a logic level of the footer node in the second phase of the clock signal; and
   an output unit connected to the first and second dynamic nodes, the output unit configured to provide an output signal having a logic level according to levels of a first voltage of the first dynamic node and a second voltage of the second dynamic node, wherein the second evaluation unit includes,
      a first p-type metal-oxide semiconductor (PMOS) transistor, the first PMOS transistor connected to a power supply voltage and the second dynamic node, the first PMOS transistor configured to precharge the second dynamic node in response to the clock signal,
      a first n-type metal-oxide semiconductor (NMOS) transistor having a drain connected to the second dynamic node, a gate connected to the footer node,
      a second NMOS transistor having a drain connected to a source of the first NMOS transistor, a source connected to a ground voltage and a gate configured to receive the clock signal,
      a third NMOS transistor having a drain connected to the footer node, a source connected to the ground voltage and a gate connected to the second dynamic node, and
      a second PMOS transistor having a source connected to the first dynamic node, a gate connected to the footer node and a drain connected to the second dynamic node.

2. The domino logic circuit of claim 1, wherein the first dynamic node and the footer node share electrical charges in the second phase of the clock signal.

3. The domino logic circuit of claim 1, wherein the second evaluation unit is configured to provide the second voltage between a first level and a second level, the first evaluation unit is configured to provide the first voltage between the first level and a third level, and the first evaluation unit is configured to provide a voltage between the third level and the second level at the footer node, the second level is lower than the first level, and the third level is lower than the first level and higher than the second level.

4. The domino logic circuit of claim 3, wherein the first level corresponds to a level of a power supply voltage and the second level corresponds to a level of a ground voltage.

5. The domino logic circuit of claim 1, wherein the first evaluation unit comprises:
   a precharge transistor configured to precharge the first dynamic node based on the clock signal;
   a logic network connected between the first dynamic node and the footer node, the logic network configured to determine the logic level of the first dynamic node in response to the input signals; and
   a pull-down transistor configured to establish a voltage level of the footer node in response to the clock signal.

6. The domino logic circuit of claim 5, wherein
   the precharge transistor is a p-type metal-oxide semiconductor (PMOS) transistor, the PMOS transistor having a source connected to a power supply voltage, a drain connected to the first dynamic node and a gate configured to receive the clock signal, and
   the pull-down transistor is an n-type metal-oxide semiconductor (NMOS) transistor, the NMOS transistor having a source connected to a ground voltage, a drain connected to the footer node and a gate configured to receive an inverted clock signal.

7. The domino logic circuit of claim 1, wherein the second NMOS transistor is configured to selectively connect the second dynamic node and the ground voltage based on the clock signal, the second PMOS transistor operates as a first keeper transistor configured to maintain a voltage level of the footer node in response to a voltage level of the second dynamic node and the third NMOS transistor is configured to operate as a second keeper transistor configured to maintain the voltage level of the second dynamic node in response to the voltage level of the footer node.

8. The domino logic circuit of claim 7, wherein a size of the second PMOS transistor is smaller than a size of the first PMOS transistor, and a size of the third NMOS transistor is smaller than sizes of the first and second NMOS transistors.

9. The domino logic circuit of claim 1, wherein the second evaluation unit is configured to provide the second voltage transitioning from the power supply voltage to the ground voltage in response to a voltage of the footer node transitioning from an intermediate level to the ground voltage, the intermediate level is between the power supply voltage and the ground voltage.

10. The domino logic circuit of claim 1, wherein the output unit comprises:
    a NAND gate configured to perform a logical NAND operation on the first and second voltages to provide the output signal.

11. The domino logic circuit of claim 10, wherein the NAND gate comprises:
    a third PMOS transistor connected between the power supply voltage and an output node, the first PMOS transistor having a gate configured to receive the first voltage, the output signal being provided at the output node,
    a fourth PMOS transistor connected between the power supply voltage and the output node in parallel with the third PMOS transistor, the second PMOS transistor having a gate configured to receive the fourth voltage, and
    fourth and fifth NMOS transistors connected in series between the output node and the ground voltage, the fourth NMOS transistor having a gate configured to receive the first voltage, the fifth NMOS transistor having a gate configured to receive the second voltage.

12. The domino logic circuit of claim 11, wherein the output unit further comprises:
    a keeper transistor connected between the power supply voltage and the first dynamic node, the keeper transistor configured to maintain a voltage level of the first dynamic node in response to a voltage level of the output node is a fifth PMOS transistor having a gate configured to receive the output signal, and a size of the fifth PMOS transistor is smaller than sizes of the third and fourth PMOS transistors.

* * * * *

UNITED STATES PATENT AND TRADEMARK OFFICE
CERTIFICATE OF CORRECTION

PATENT NO. : 8,542,033 B2  
APPLICATION NO. : 13/234811  
DATED : September 24, 2013  
INVENTOR(S) : Hyoung-Wook Lee et al.

Page 1 of 1

It is certified that error appears in the above-identified patent and that said Letters Patent is hereby corrected as shown below:

On the Title Page, Item (73) Assignee should read

--(73)    Assignee: Samsung Electronics Co., Ltd., Gyeonggi-do (KR)
           Seoul National University R&D Foundation, Seoul (KR)--.

Signed and Sealed this
Seventh Day of October, 2014

Michelle K. Lee
*Deputy Director of the United States Patent and Trademark Office*